United States Patent
Raymond

(10) Patent No.: US 9,477,033 B2
(45) Date of Patent: Oct. 25, 2016

(54) MULTI-LAYERED WAVEGUIDE FOR CAPTURING SOLAR ENERGY

(71) Applicant: LUMENCO, LLC, Englewood, CO (US)

(72) Inventor: Mark A. Raymond, Littleton, CO (US)

(73) Assignee: LUMENCO, LLC, Englewood, CO (US)

( * ) Notice: Subject to any disclaimer, the term of this patent is extended or adjusted under 35 U.S.C. 154(b) by 147 days.

(21) Appl. No.: 14/258,759

(22) Filed: Apr. 22, 2014

(65) Prior Publication Data

US 2014/0311570 A1    Oct. 23, 2014

Related U.S. Application Data

(60) Provisional application No. 61/815,001, filed on Apr. 23, 2013.

(51) Int. Cl.
| | |
|---|---|
| *F21V 8/00* | (2006.01) |
| *H01L 31/054* | (2014.01) |
| *G02B 5/04* | (2006.01) |

(52) U.S. Cl.
CPC ............ *G02B 6/0076* (2013.01); *G02B 5/045* (2013.01); *H01L 31/0547* (2014.12); *G02B 6/0036* (2013.01); *G02B 6/0038* (2013.01); *Y02E 10/52* (2013.01)

(58) Field of Classification Search
CPC ....... Y02E 10/52; Y02E 10/50; Y02E 10/40; H01L 31/0547; H01L 31/055; F24J 2/067; F24J 2/05; F24J 2/1095; G02B 19/0042; G02B 7/183
See application file for complete search history.

(56) References Cited

U.S. PATENT DOCUMENTS

| | | | | |
|---|---|---|---|---|
| 5,575,860 A | * | 11/1996 | Cherney | .................. F24J 2/067 136/245 |
| 2002/0000244 A1 | * | 1/2002 | Zaidi | .................. H01L 31/0232 136/259 |
| 2009/0126792 A1 | | 5/2009 | Gruhlke et al. | |

(Continued)

FOREIGN PATENT DOCUMENTS

WO     2010151254 A1     12/2010

OTHER PUBLICATIONS

International Search Report, PCT/US2014/034979, dated Sep. 2, 2014.

*Primary Examiner* — Thomas A Hollweg
*Assistant Examiner* — Mary A El Shammaa
(74) *Attorney, Agent, or Firm* — Marsh Fischmann & Breyfogle LLP; Kent A. Lembke

(57) ABSTRACT

A waveguide for use in solar power systems to capture sunlight without solar tracking. The waveguide includes a first transparent layer with a first surface receiving sunlight, and the waveguide includes a second surface, opposite the first surface of the first layer, including recessed surfaces (or "microstructures") each defined by sidewalls extending from the second surface toward the first surface of the first layer. The waveguide includes a second layer of transparent material with a first surface proximate to the second surface of the first layer for receiving a portion of the sunlight transmitted through the first layer. The second layer has a second surface, opposite the first surface, including recessed surfaces of the same or differing shape, size, location, and orientation as those of the first layer. The recessed surfaces of the first and second layers capture sunlight of differing ranges of incidence angles with total internal reflection (TIR).

22 Claims, 7 Drawing Sheets

(56) References Cited

U.S. PATENT DOCUMENTS

| | | | |
|---|---|---|---|
| 2009/0199900 A1 | 8/2009 | Bita et al. | |
| 2011/0011449 A1* | 1/2011 | Morgan | H01L 29/70 136/255 |
| 2011/0226332 A1* | 9/2011 | Ford | F24J 2/067 136/259 |
| 2012/0012741 A1* | 1/2012 | Vasylyev | G01J 1/0407 250/237 R |
| 2012/0024374 A1 | 2/2012 | Knox et al. | |
| 2012/0055552 A1 | 3/2012 | Morgan et al. | |
| 2012/0135512 A1* | 5/2012 | Vasylyev | G02B 3/005 435/292.1 |
| 2013/0014814 A1* | 1/2013 | Han | H01L 31/02363 136/255 |
| 2014/0011013 A1* | 1/2014 | Jin | B05D 5/08 428/297.4 |
| 2014/0360578 A1* | 12/2014 | Nichol | H01L 31/054 136/259 |

* cited by examiner

MULTI-LAYERED WAVEGUIDE FOR CAPTURING SOLAR ENERGY

CROSS-REFERENCE TO RELATED APPLICATIONS

This application claims the benefit of U.S. Provisional Application No. 61/815,001, filed Apr. 23, 2013, which is incorporated herein by reference in its entirety.

BACKGROUND

1. Field of the Description

This description is generally directed toward more effectively capturing solar energy, and, more particularly, to a waveguide, and to solar assemblies with such waveguides, that is adapted for effectively capturing sunlight or solar energy without the need for solar tracking.

2. Relevant Background

Solar energy is captured using a range of technologies including solar photovoltaics (PV), solar heating, and solar thermal electricity. Active solar technologies often use PV panels or solar thermal collectors to harness the Sun's energy. There is a growing demand for increased development of solar technologies such as improved solar power systems to provide inexhaustible and clean energy to replace fossil fuels that may be depleted and whose use may harm the environment. For example, there has been a growing trend to use solar power, which is the conversion of sunlight into electricity using photovoltaics, to provide an increasing percentage of a nation's electrical power needs. To this end, solar panel or PV material may be utilized and is formed of numerous PV cells, with each PV cell being a device that converts light into electric current using the photoelectric effect.

One issue hindering more widespread adoption of solar energy technologies is cost, e.g., the cost of producing a unit of electricity with solar power compared with the cost of producing the same amount of electricity with other power sources. While solar costs have continued to fall in recent years, the costs associated with capturing solar energy are still significantly higher than other sources of energy especially when it is understood that solar energy can be used to produce electricity (or provide heat in thermal systems) during the daytime and only have a primetime power generation of about four hours. The capital cost is believed to be out of synchronization with the electricity production by many in the energy industry and society in general considering levelized costs of coal, natural gas, and other electricity sources such as nuclear power. Hence, it is likely that a breakthrough is needed in how solar energy is captured to move its use, such as to generate electricity, in parity, with regard to costs and other issues, with other forms of presently available energy.

With regard to conversion of solar energy into electricity, one of the primary costs is the PV cells or PV material (sometimes labeled the PV conductor or absorber). PV cells are expensive in part due to the manufacturing complexities and also due to the cost of materials required for the thin films or layers of such PV cells such as cadmium telluride, mono-crystalline silicon, multi-crystalline silicon, copper indium gallium selenide (CIGS), and the like. The amount of PV material can be reduced to lower costs of a solar power system, but this would require a significant increase in efficiency as typical PV cells have an efficiency of well below twenty percent (e.g., either have to increase conversion efficiency or direct more sunlight onto each PV cell).

In some applications, a solar power system may be configured to concentrate the solar energy or sunlight so as to try to reduce the amount of PV material used in the system. However, an ongoing challenge in such concentrator-based systems is the need for focusing and the need to track the Sun as it moves across the sky and has its path change with seasons, and, due to these challenges, these systems have not been widely adopted or reduced the overall cost of capturing solar energy.

There remains a need for technology that is effective in reducing the costs associated with capturing solar energy for conversion into electricity or heat. Preferably such a technology would be adapted to facilitate the use of reduced amounts of PV material used in a solar power system while still generating the same or more electricity.

SUMMARY

The inventor recognized that these and other needs could be provided by an optical waveguide that is formed by combining two or more layers of thin films (e.g., sheets of glass, plastic, ceramic, polymer, or other transparent (or substantially transparent) material) that are each configured to be a waveguide. Particularly, each waveguide layer is adapted to receive light on a first planar surface, to trap and reflect light using total internal reflection (TIR) with a second surface parallel to and spaced apart from the first planar surface and with a plurality of microstructures extending up into the layer's material (e.g., the microstructures are a plurality of recesses or shaped micro dimples on the second surface), and to guide the light to the ends or edges of the waveguide layers where it can be absorbed by PV cells/PV material or with a thermal power absorber/collector or otherwise captured for energy conversion. The waveguide or waveguide assembly is adapted in this way for collecting light, concentrating the light, and disbursing or guiding it to the edges of the layers.

The waveguide assembly or film, even considering the cost of providing the repeating patterns of microstructures (e.g., repeating patterns of dimples, recessed surfaces, or pockets formed by one or more sidewalls extending into the thin film surface), multiple layers, and adhesives, costs a fraction of conventional PV materials. In addition, the waveguide assembly can be formed to be glass-free or with glass-free construction if it is desired to provide a more durable and flexible waveguide assembly with plastic or polymer sheets or films of light-accepting materials. The waveguide assembly or film is adapted to effectively collect and concentrate sunlight regardless of incoming angles striking the upper, planar surface of the waveguide assembly, which can decrease the amount of PV material used in a solar power system with the waveguide assembly having an efficiency of up to ninety-nine percent or even more.

More particularly, a waveguide is provided for use in solar power systems to capture sunlight without a need for solar tracking. The waveguide includes a first layer of substantially transparent material (e.g., a glass, a polymer or plastic, or a ceramic) with a first thickness. The first layer has a first surface that is exterior of or outward facing from the waveguide for receiving sunlight, and the waveguide includes a second surface, opposite the first surface of the first layer, including a plurality of recessed surfaces (or "microstructures") each defined by one or more sidewall extending from the second surface toward the first surface of the first layer. The waveguide also includes a second layer of substantially transparent material with a second thickness. The second layer has a first surface proximate to the second surface of the first layer for receiving a portion of the sunlight transmitted through the first layer toward the second layer. The second layer has a second surface, opposite the first surface of the second layer, including a plurality of recessed surfaces ("microstructures") each defined by one or more sidewall extending from the second surface toward the first surface of the second layer. Significantly, the recessed surfaces of the first layer are configured to trap at least a portion of the sunlight in the first layer with total internal reflection (TIR), and the recessed surfaces of the second layer are configured to trap at least a portion of the sunlight transmitted through the first layer toward the second layer with TIR.

In some embodiments, the first surfaces of the first and second layers are planar and are parallel. The recessed surfaces of the first layer provide TIR of light striking the first surface of the first layer in a first range of incidence angles, and the recessed surfaces of the second layer provide TIR of light striking the first surface of the first layer in a second range of incidence angles differing from the first range of incidence angles. The first range of incidence angles may be −5 to +5 degrees and the second range of incidence angles includes −5 to −15 degrees and +5 to +15 degrees.

In some cases, the recessed surfaces have sidewalls defining a symmetric pyramid (e.g., a 4-sided pyramid microstructure) or a symmetric cone. The pyramids or cones defined by the sidewalls of the recessed surfaces have heights of less than about 75 percent, more preferably less than about 50 percent, and even more preferably less than about 25 percent of the first and second thicknesses of the first layer and the second layer, respectively. In some cases, the heights of the pyramids or cones defined by the sidewalls of the recessed surfaces are equal within each of the first and second layers and differ between the first and second layers.

In some embodiments, spacing between adjacent ones of the recessed surfaces differs between the first and second layers (e.g., the repeated pattern differs among layers, the density of microstructures differs on the bottom layer surface, or the location of the structures may be staggered to avoid (or provide) shadowing between layers). It may be useful for adjacent ones of the pyramids defined by the sidewalls to have first and second orientations with the second orientations being rotated by 30 to 60 degrees (e.g., rotate neighboring pyramids by 45 degrees or the like).

In some implementations of the waveguide, an air-filled gap is provided between the second surface of the first layer and the first surface of the second layer. In such implementations, the air-filled gap can be formed by providing a plurality of spaced-apart dots or lines of material between the second surface of the first layer and the first surface of the second layer. In other implementations, a gap is provided between the second surface of the first layer and the first surface of the second layer, and the gap is filled with a material with an index of refraction that differs from an index of refraction of the transparent materials of the first and second layers by more than 10 percent. In still other implementations, an adhesive layer is included between the second surface of the first layer and the first surface of the second layer. In these implementations, the adhesive layer can be chosen to have an index of refraction that differs from an index of refraction of the transparent material of the first layer by more than 10 percent.

DETAILED DESCRIPTION

Figure 1:
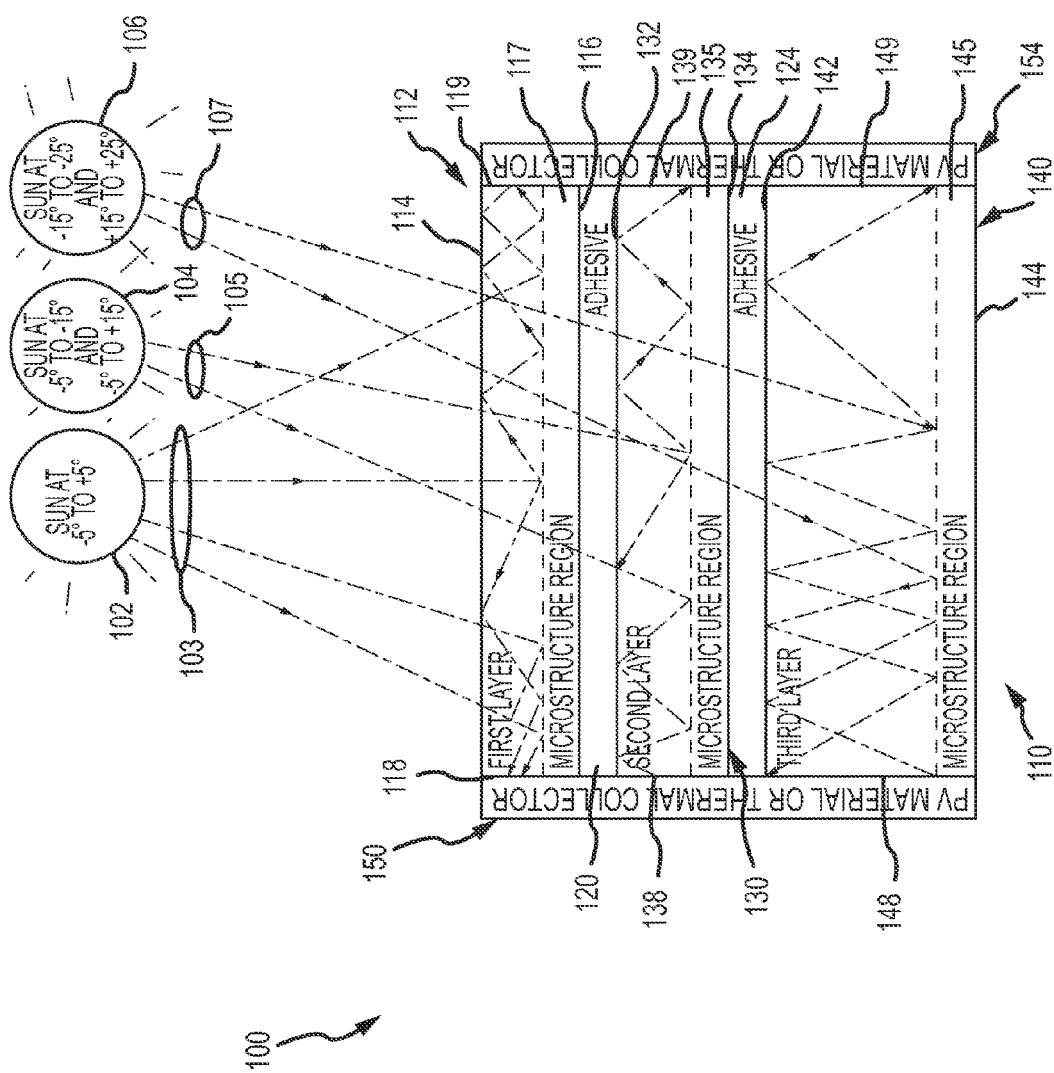
FIG. 1 illustrates a schematic end view of a solar power system of one embodiment of the description showing use of a multi-layered optical waveguide.

Briefly, the present description is directed toward multi-layered optical waveguides and solar power systems including such waveguides to collect solar energy without the need for solar tracking. Each waveguide layer may be configured to capture, through total internal reflection (TIR), sunlight in a different range of incidence angles (e.g., angles associated with a prime collection time such as noon, angles associated with a less prime time such as 10 AM, angles with a second less prime time such as 8 AM, and so on). To this end, each waveguide layer is formed of a sheet of optical material such as glass, plastic, polymer, ceramic, or the like that is substantially transparent to sunlight. Each sheet has a first or upper side that is planar and a second side that has a repeating pattern of dimples, recessed surfaces, or pockets (also called "microstructures" herein) that are configured to provide the TIR for a range of incidence angles. Adhesive of a particular index of refraction (e.g., one close to the material of the nearby waveguide layers) may be used to combine adjacent waveguide layers. During use, captured light is guided within each of the different waveguide layers to the edges of the sheet with the microstructures. A solar power system may be formed by positioning PV material or panels at these edges or by providing a thermal collector or absorber along the edges of the sheets.

Prior to turning to the figures and exemplary implementations, it may be useful to provide a further overview of the waveguides or waveguide assemblies discovered by the inventor. An optical waveguide may be made from multiple layers of plastic, glass, or other transparent material. Each of these waveguide layers is adapted to collect incoming rays of light and to reflect or deflect them inside the waveguide layer so that the rays are contained using TIR. The light is then collected at the sides of the waveguide layer (e.g., edges of thin polymer or glass sheet) when the waveguide assembly is positioned within a solar power system (e.g., with PV cells along the sides of each waveguide layer).

In some implementations, the waveguide is designed so that each waveguide layer collects specific incoming angles of the sunlight (relative to the microstructure designs inside the guide layer) striking the upper surfaces of each layer. For example, the first layer may be designed for angles from −5 degrees to +5 degrees in all directions whereas the next layer is designed to collect rays from −15 degrees to −5 degrees and +5 degrees to +15 degrees and so on. The layers can be bonded together with adhesive or have air gaps between them. The microstructures (or repeating patterns of recessed surfaces or dimples) typically are designed with proper polarization curves pursuant to the refractive indices of the materials, adhesive, and air so as to reflect or bounce the received light into the waveguide layers within a 42 degree angle so as to maintain TIR.

An absorber such as PV material is typically placed at the edges of the waveguide layers or in strips on the top or bottom surfaces to form a solar power system/assembly that is able to both collect the sunlight or light rays and to absorb the sunlight or light rays after they are guided to the layer edges/ends. This solar power system or device requires as little as 2 to 5 percent of the PV material as compared to a traditional solar panel to absorb and convert the same amount of solar energy. Further, the solar power system will provide a concentration ratio of over 10 to 1 and up to 200 to 1 or more. The cost to manufacture this solar power system is roughly 60 to 80 percent less than the present conventional PV device of similar capacity (electrical output, for example). Each of the waveguides may vary in their total thickness, such as from 0.003 inches up to about 1.000 inches. Note, the multi-layer waveguides may be used in solar power systems with conventional components (e.g., solar panel or PV material provides at the edges of the waveguide layers that is used to generate electricity that is then fed to a power grid) or in non-traditional applications such as in building materials, fences, shingles, military products, and the like.

FIG. 1 illustrates a solar power system 100 of one embodiment of the description that is configured for collecting radiation or sunlight from the Sun without tracking. In this example, the system 100 is adapted particularly for collecting sunlight with the Sun (as shown at 102) providing light 103 at incidence angles in the range of −5 degrees to +5 degrees, with the Sun (as shown at 104) providing light 105 in the ranges of −5 to −15 degrees and +5 to +15 degrees, and also with the Sun (as shown at 106) providing light 107 in the ranges of −15 to −25 degrees and +15 to +25 degrees (or overall from −25 to 25 degrees) without the need for solar tracking (i.e., the system 100 may have stationary components). Other incidence angle ranges may be used to implement a system 100 with these only be exemplary ranges.

To this end, the system 100 includes a multi-layered waveguide (or waveguide assembly) 110 with first, second, and third layers 112, 130, and 140 (or upper, middle (or intermediate), and lower layers in this case). Each layer may be formed out of a sheet or film of optically transparent or transmissive material such as glass, ceramic, plastic, polymers, or the like. A single material may be used for all layers 112, 130, 140 or one or more of the layers 112, 130, 140 may be formed of a different material. Each layer is formed to capture light striking its upper, planar surface within a range of incidence angles. For example, the upper or first layer 112 of the waveguide 110 is fabricated so as to capture through TIR incidence light 103 from the Sun 102 in the range of −5 to +5 degrees. The upper layer 112 has a first or "top" planar surface 114 that the light 103 initially strikes and is transmitted into the layer 112.

The upper layer 112 also has a second or "bottom" surface 116 (opposite and parallel to the first surface 114) that is configured (through fabrication processes) to have a plurality of dimples or recessed surfaces that provide a microstructure region 117. The dimples or recessed surfaces may take the form of a repeating pattern of four-sided pyramids, cones, or other shapes with sidewalls extending upward from the bottom surface 116 toward the top surface 114. The shape, size, and density (defined by the spacing between adjacent microstructures or dimples) are selected so as to obtain TIR of the incident sunlight 103, with this light 103 being bounced back from the microstructure region 117 as shown in FIG. 1. The light 103 remains trapped in the material of the layer 112 due to TIR and is guided to one or both ends/edges 118, 119 of the top/first layer 112.

The power system 100 further includes solar energy conversion components to convert the solar energy 103 into electricity or thermal energy. To this end, the system 100 includes PV material (e.g., a solar panel or set of solar cells) or a thermal collector/absorber 150, 154 positioned at each end 118, 119. In this way, the amount of PV material (or thermal collector/absorber) 150, 154 can be significantly reduced compared with convention solar power systems as the sunlight 103 that is originally striking the relatively large area of the top surface 114 of waveguide layer 112 is concentrated and guided to the sides/edges 118, 119, which may have very small surface area (e.g., the thickness of a plastic film multiplied by the width (or length) of the layer 112 is much smaller than the area of the upper surface 114). In the case where a solar panel is used for the PV material 150, 154, the panel may be arranged to be orthogonal to the planar upper surface 114 to enhance solar conversion.

The waveguide 110 includes a second or intermediate layer 130 that is attached to the first layer 112 with a film of light transmissive adhesive 120 (although an air gap may be provided instead as explained herein) with the bottom surface 116 of the top layer 112 facing or proximate to a planar top or first surface 132 of the intermediate layer 130. The intermediate layer 130 includes a second or bottom surface 134 with a plurality of dimples or recessed surfaces (i.e., microstructures) that form a microstructure region 135. The shape, size, and density of the microstructures in the region 135 often will vary from that provided in the microstructure region of the first layer 112 so that the region 135 of the intermediate layer 130 is configured to provide TIR for sunlight 105 being in a different range of incidence angles.

As shown in FIG. 1, the sunlight 105 from the Sun 104 strikes the top surface 114 of the first layer 112 but, in contrast to light 103, the light 105 is not captured (or not wholly capture) by the first microstructure region 117. Instead, the light 105 passes through (at least in part) to the top surface 132 of the second waveguide layer 130 (via the adhesive (or air) layer 120) where it is transmitted into the material of the layer 130. The light 105 then strikes the microstructures in the region 135 which causes the light 105 to be trapped by TIR and bounced back toward the top surface 132. The trapped light 105 is then guided to ends or edges 138, 139 of the second waveguide layer 130 where it is then received by the PV material/thermal collectors 150, 154 for conversion into electricity or thermal energy. In this way, light 105 that would have simply passed through the first layer 112 and been lost from the system 100 is instead captured for energy conversion by the second layer 130, without solar tracking or movement of the waveguide 110.

Further, as shown in FIG. 1, the waveguide 110 also includes a third or lower layer 140 that also includes a planar upper surface 142. The layer 140 is attached to the intermediate layer 130 with adhesive layer 124 (or with an air gap in some implementations) with the planar surface 142 facing or proximate to the bottom surface 134 with the microstructure region 135. As shown, the layers or sheets 112, 130, 140 are typically arranged or stacked in the waveguide 110 so as to be parallel. The lower layer 140 also includes a bottom or second surface or side 144 opposite the top or first surface 142, and a plurality of dimples or recessed surfaces (or microstructures) are provided with sidewalls extending toward the top or first surface 142 of the layer 140. This provides the microstructure region 145 of the lower or third waveguide layer 140.

The microstructure region 145 in this example is configured to provide TIR of the sunlight 107 from the Sun 106, which is providing light 107 at −15 to −25 degrees or at +15 to +25 degrees, and the microstructure region 145 includes microstructures specifically designed with size, shape, and density on the second or bottom surface 144 to provide TIR of the light 107 in the layer 140. Particularly, as shown in FIG. 1, the sunlight 107 first strikes the upper surface 114 of the first layer 112 and is transmitted through the layer 112 to the microstructure region 117. The microstructures of region 117 are not effective (or not wholly effective) in trapping this light 107 with TIR so that the light 107 passes through the bottom surface 116 of waveguide layer 112 and through adhesive 120. It strikes top surface 132 of the intermediate layer 130 and is transmitted to the microstructure region 135, which has microstructures that are not effective (or not wholly effective) in trapping the light 107 with TIR such that the light 107 passes through layer 130 and adhesive 124. The light 107 then strikes the top surface 142 and is transmitted through material of the layer 140 until it strikes the microstructures of the microstructure region 145. These microstructure of region 145 capture all or a large percentage of the sunlight 107 with TIR, and the sunlight 107 bounces back toward the top surface 142 which guides it toward the edges or ends 148, 149 of the layer/sheet 140. The PV material or thermal collectors 150, 154 receive the sunlight 107 and convert it into electricity or thermal energy.

Figure 7:
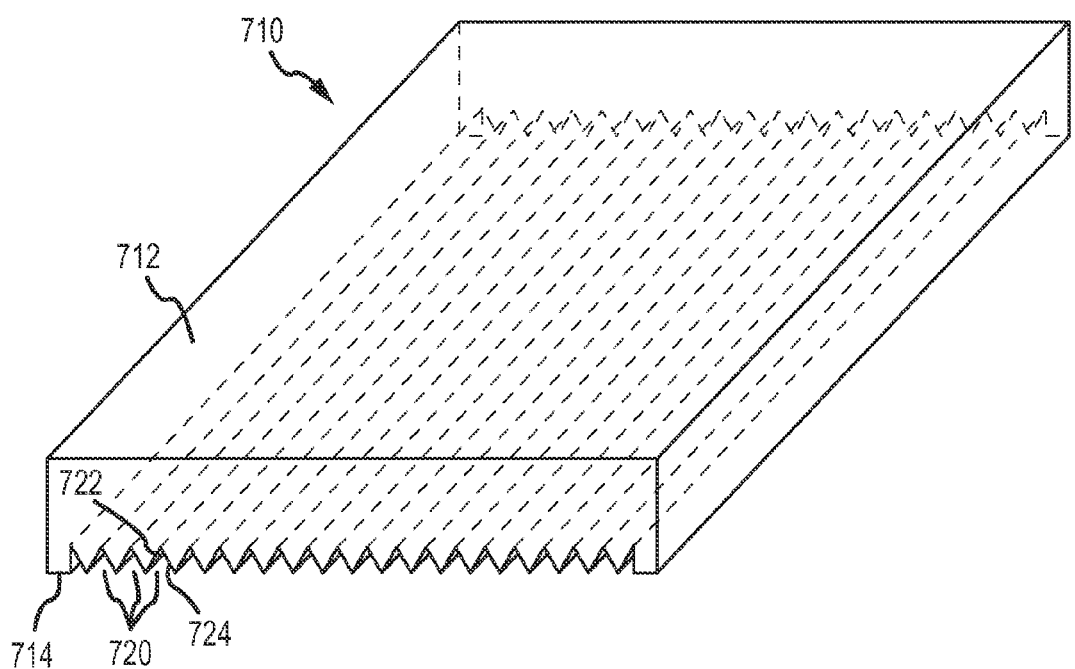
FIG. 7 illustrates a perspective end view of a waveguide layer that may be used in a multi-layered waveguide of the present description.

As discussed above, microstructures are placed or formed in a sheet or film of transparent material ("sheet" and "film" are used here to generically refer to any clear substrate) to provide the selective TIR functionality of each layer of a waveguide. Specifically, the microstructures are configured to direct light at specific angles passed into the layer and striking the microstructures to be directed using TIR into a wafer or waveguide layer. For embodiments of waveguides described herein, microstructures are placed into the bottom of the film and are generally protruding up from the bottom of the film and generally are not linear (as shown in FIG. 7) but, instead, often are cone shaped or pyramidal in shape. Each layer of a waveguide is designed to handle either all incoming rays from a specific angle (or range of angles more typically) or a portion of those rays. The microstructures are designed with a very specific placement (in a repeating pattern on the bottom surface), spacing, and orientation, with these configurations/designs for the microstructures being typically verified as useful and effective using one or more ray tracing programs.

Figure 2:
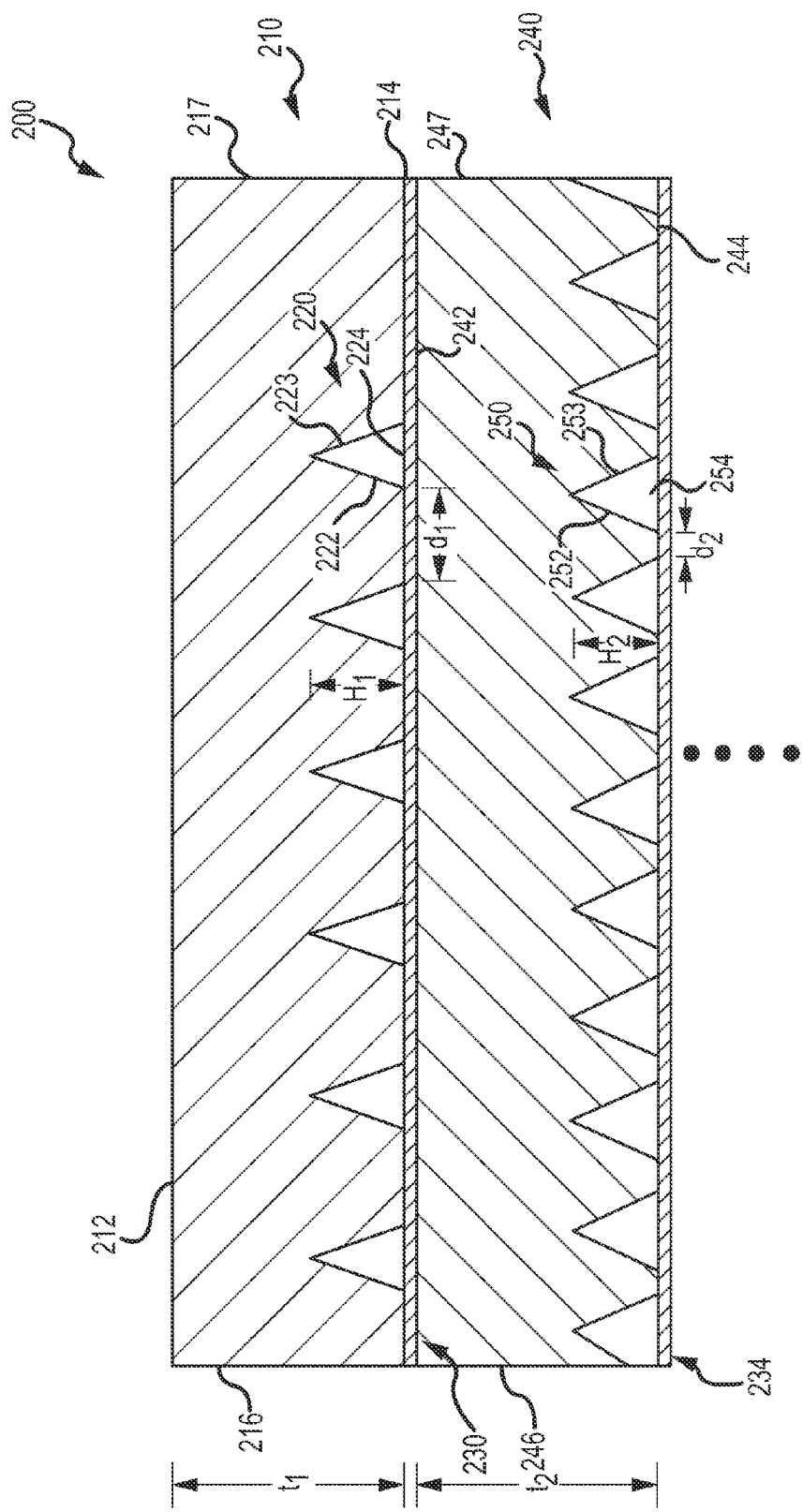
FIG. 2 is a cross sectional view of a multi-layered waveguide that includes four-side pyramid shaped dimples or recessed surfaces to provide microstructure regions in each waveguide layer.

FIG. 2 illustrates a cross section of a waveguide 200 that may be used in a solar power system to more effectively capture incident sunlight over a range of incidence angles. As shown, the waveguide 200 includes a first or upper layer 210 and a second or lower layer 240 (and two layers are shown but one, two, or more additional layers may be provided in the waveguide 200 and stacked or layered underneath the second layer 240 as shown with continuation dots in FIG. 2). The layers 210, 240 are mated together using a layer of adhesive 230, 234 in this example that may be chosen to have a particular refractive index (or index of refraction) based on the refractive index of the layers 210, 240. For example, the first and second layers 210, 240 may be formed from a sheet or film of a polymer with a refractive index in the range of 1.5 to 1.7 while the adhesive layers 230, 234 are formed of an adhesive material that has a refractive index of about 1.3 or the like. In some cases, the adhesive material used for adhesive layer 230 and/or adhesive layer 234 is chosen such that it has a differential of more than ten percent relative to the material (e.g., polymer) of the layer 210 and/or layer 240 of the waveguide 200.

The first layer 210 may be adapted for capturing sunlight having an incidence angle in a first range (e.g., a range associated with a primetime for solar energy collection such as 11 AM to 1 PM), and the second layer 240 may be adapted for capturing sunlight having an incidence angle in a second range (e.g., a range associated with a less than prime time for solar energy collection such as between 9 AM and 11 AM and also between 1 PM and 3 PM or the like). To this end, the first layer 210 is formed of a sheet or film of material (such as a polymer, glass, ceramic, or the like) with a first thickness, $t_1$ (e.g., several mils up to 1 inch or more). The first layer 210 includes a first or upper planar surface 212 and a second or bottom surface 214, which may generally be planar but is fabricated so as to include a microstructure region to provide TIR for light in a particular incidence angle range.

Particularly in this example, a plurality of microstructures 220 are provided in the second or bottom surface 214 of layer 210. Each microstructure 220 is shaped in the form of a four sided pyramid that is formed with four sidewalls, with three sidewalls 222, 223, 224 shown in the cross sectional view, protruding or extending a height, $H_1$, upward into the material of the layer 210 from the bottom surface 214. The height, $H_1$, (or depth of the recessed surface, dimple, or microstructure 220) may be stated as a percentage (or fraction) of the thickness, $t_1$, of the layer 210 such as less than about 75 percent (or less than three quarters) of the thickness, $t_1$, with some preferred embodiments providing microstructures that are less than about 25 percent (or less than one quarter) of the thickness, $t_1$. In many implementations, the height, $H_1$, (and height, $H_2$) is selected to be in the range of 200 nanometers up to 1 inch. The slope of the sidewalls 222, 223, 224 (which helps define a shape of the pyramid) is chosen to achieve TIR for a desired range of incidence angles (e.g., the sidewalls may each extend into the layer 210 at an angle of 30 to 70 degrees). The spacing, $d_1$, between adjacent microstructures 220 may also be chosen to obtain a magnitude of light capture, with upper layers such as layer 210 typically having a larger microstructure spacing, $d_1$, or lower density of microstructures (e.g., $d_1$ may be 2 to 5 times that of the next layers spacing, $d_2$).

The second layer 240 is formed of a sheet or film of material (such as a polymer, glass, ceramic, or the like) with a first thickness, $t_1$ (e.g., several mils up to 1 inch or more), and the material and thickness may be the same as that found in the first layer 210 or one or both of these design parameters may differ between layers to provide desired TIR functionality and to capture and guide different portions of the received sunlight toward the edges 246, 247. The second layer 240 includes a first or upper planar surface 242 and a second or bottom surface 244, which may generally be planar but is fabricated so as to include a microstructure region to provide TIR for light in a particular incidence angle range.

Particularly in this example, a plurality of microstructures 250 are provided in the second or bottom surface 244 of layer 240. Each microstructure 250 is shaped in the form of a four sided pyramid that is formed with four sidewalls, with three sidewalls 252, 253, 254 shown in the cross sectional view of FIG. 2, protruding or extending a height, $H_2$, upward into the material of the layer 240 from the bottom surface 244. The height, $H_2$, (or depth of the recessed surface, dimple, or microstructure 250) may be stated as a percentage (or fraction) of the thickness, $t_2$, of the layer 240 such as less than about 75 percent (or less than three quarters) of the thickness, $t_2$, with some preferred embodiments providing microstructures that are less than about 25 percent (or less than one quarter) of the thickness, $t_2$. The slope of the sidewalls 252, 253, 254 (which helps define a shape of the pyramid) is chosen to achieve TIR for a desired range of incidence angles (e.g., the sidewalls may each extend into the layer 240 at an angle of 30 to 70 degrees).

In some implementations of the waveguide 200, the top few layers (e.g., layers 210, 240 and optionally one or more additional layers) are designed to deflect light, into the layers or films of the waveguide, with incidence angles in the range of −20 to +20 degrees in all directions while the remaining layers of the waveguide are designed to handle (i.e., capture using TIR provided by their microstructure region being) rays with incidence angles from about +20 to +85 degrees and −20 to −85 degrees in all directions. In many waveguides such as waveguide 200, it will make most sense to have the top layers engineered for the prime time sunlight, e.g., for capturing sunlight or rays striking the waveguide at incidence angles in the range of −30 to +30 degrees.

Figure 3:
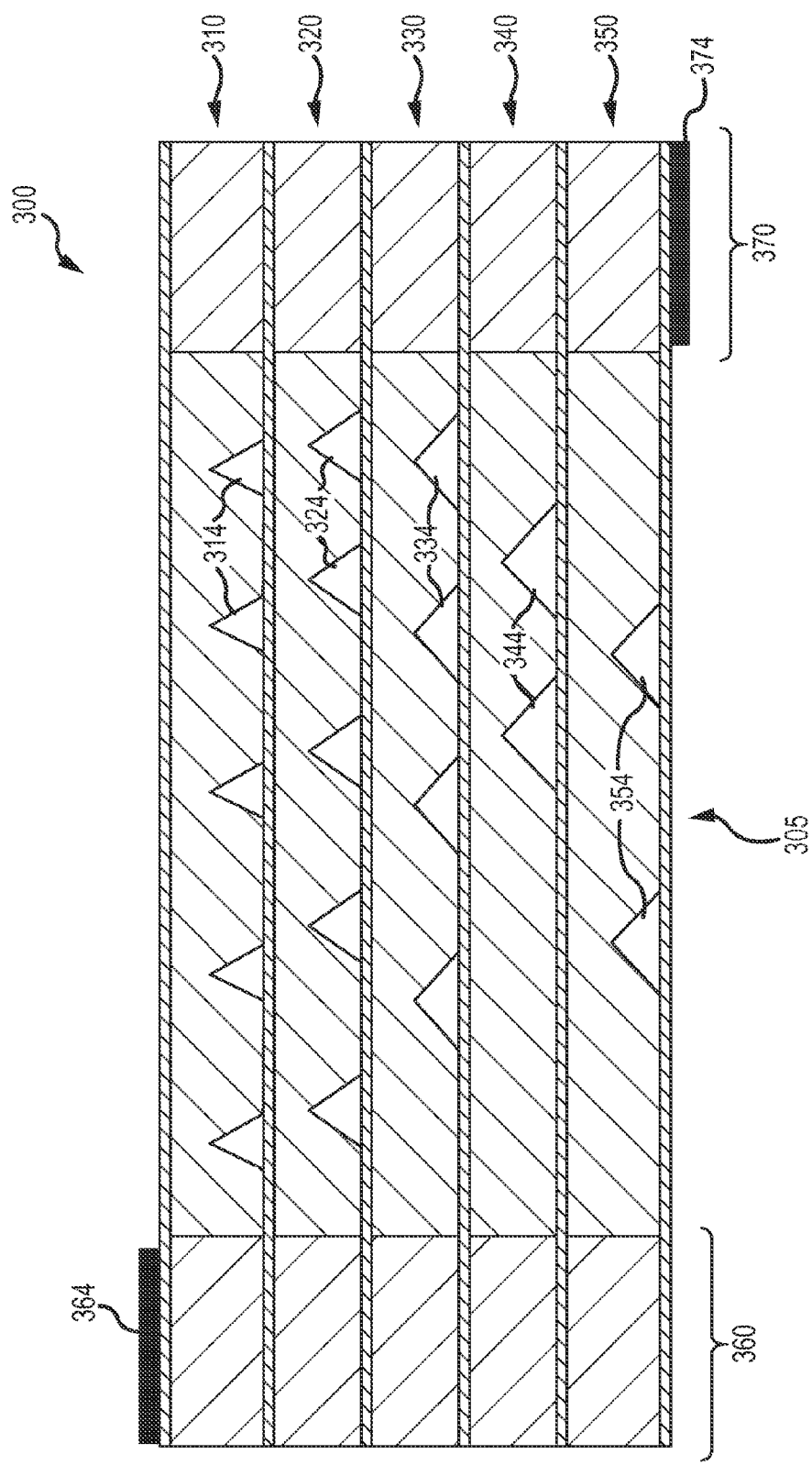
FIG. 3 is a cross sectional view of a solar power system or assembly with a waveguide having five layers each with a different repeating pattern of microstructures and/or microstructures of differing size and shape.

FIG. 3 illustrates a solar power system 300 with a waveguide 305 that includes a first (uppermost) layer 310, a second layer 320, a third layer 330, a fourth layer 340, and a fifth (bottommost) layer 350. Each layer includes microstructures 314, 324, 334, 344, 354 that are designed to capture through TIR a subset of the rays striking the upper layer 310 first depending on the incidence angle of that received ray or sunlight. The waveguide 305 is shown in simplistic form as the number of microstructures in each layer typically would be much more numerous than shown. However, FIG. 3 is useful for showing that the spacing (density) of the microstructures may vary from layer to layer such that more microstructures may be provided in some layers than others, for showing the shapes of the microstructures typically will differ between layers (e.g., the four sided pyramids may have differing heights and have their sides angled inward at differing angles (i.e., the sides may have different slopes)), and for showing that the repeated patterns of the microstructures can be selected so that the microstructures of differing layers are offset (at least partially) from each other (e.g., are not stacked and are staggered (when viewed from above or from the side) but may actually be placed in the gap between two microstructures of a prior or more upper layer in the stack of the waveguide 305 as can be seen with microstructure 354 of layer 350 being positioned in the gap or space between microstructures 344 in layer 340).

As can be seen, the solar power system 300 also includes a pair of absorber assemblies 360, 370 at the opposite sides or edges of the layers 310, 320, 330, 340, 350 (which may be bonded together using any of the techniques described herein). In this region, the layers 310, 320, 330, 340, and 350 are free of microstructures such that the previously trapped sunlight may be guided and/or concentrated onto solar panels (or PV material components) or thermal collectors 364 and 374. As shown, the solar panels/thermal collectors 364, 374 may be provided on the top or upper side (side exposed to or facing the Sun) of the waveguide 305 as shown at 364 or may be on the bottom or lower side of the waveguide 305.

As the rays go through one layer or film of the waveguide to the next, the layers are separated by air or by an adhesive layer that has an index of refraction that is lower than that of the layer or film of the waveguide. As discussed with reference to FIGS. 1, 2, and 3, the microstructures in the bottom surfaces of the waveguide layers are engineered or designed so that the light reflects into the film/layer such as at a perpendicular angle to the incoming ray. This is accomplished in some embodiments by selecting microstructures that have a polarization relative to the refractive index of the bottom or second surface of each layer.

In some embodiments, it may be desirable for the waveguide to be fabricated such that there are air pockets or gaps between adjacent layers. This may be achieved through the use of a structural spacer such as at or near the end of the various layers or through the use of adhesive (e.g., adhesive or glue with an index of refraction less than the material of the layers) that may be provided in spaced apart locations rather than as a solid film (as shown in FIGS. 1 and 2). The provision of an air gap or at least air pockets is desirable because, in general, the greater the differential refractive index between surfaces of the waveguide the more refraction occurs, which can lead to reduced sunlight capture. Since air is the ideal differential refractive element, spacers or other devices can be used to provide an air gap between layers of the waveguide so that the index differential is maintained between adjacent layers. The spacers can be built into the surfaces of the waveguide layers themselves or be placed on the bottom surface or top surface of a layer such as with an intermittent coating or glue dots. The number of spacers used typically is minimized or limited because the spacers provide a location where light trapped in layers using TIR can escape, which reduces the efficiency of a power system using such waveguides.

Figure 4A:
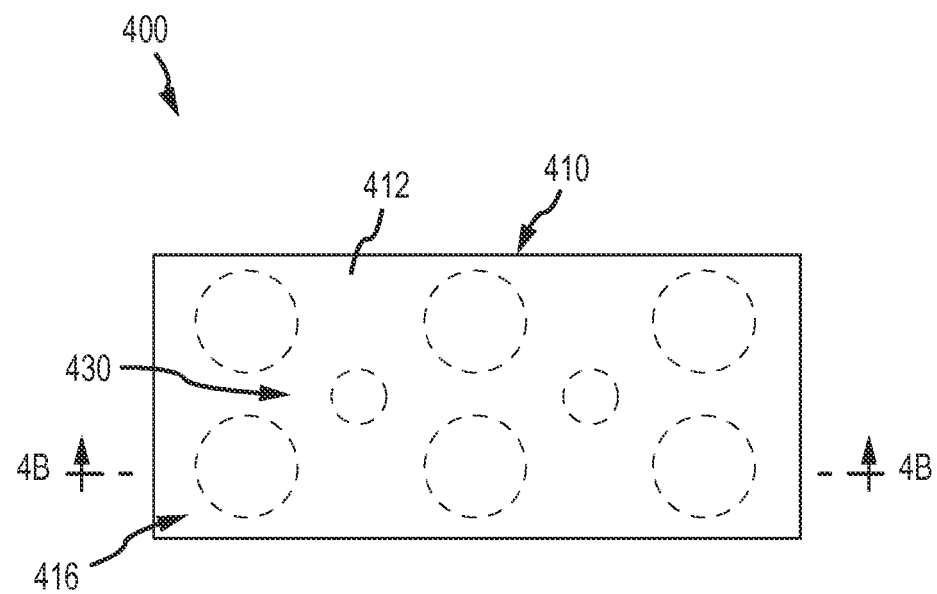
FIGS. 4A and 4B illustrate a top view and a partial sectional view, respectively, of another waveguide of the present description using conical-shaped recessed surfaces or dimples ("microstructures") along with spaced apart glue or coating dots to provide an air gap or space between adjacent layers of the waveguide.
Figure 4B:
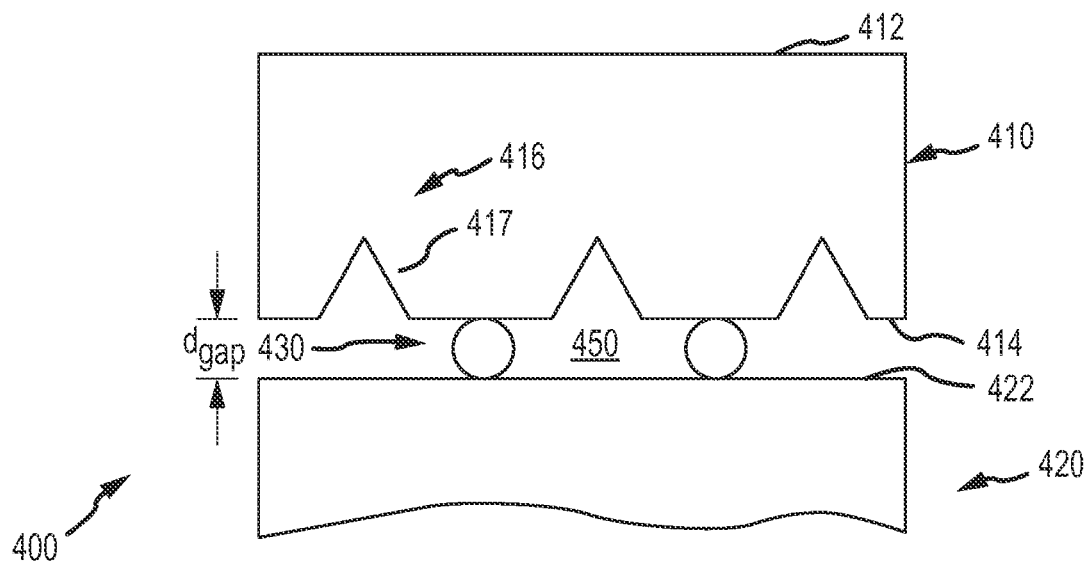

FIGS. 4A and 4B illustrate a top view and a partial sectional view, respectively, of another waveguide 400 of the present description using conical-shaped recessed surfaces or dimples ("microstructures") 416 along with spaced apart glue or coating dots 430 to provide an air gap or space 450 between adjacent layers 410, 420 of the waveguide 400. A top or first surface 412 of a first or upper waveguide layer 410 would be positioned in a solar power assembly to be facing outward (from the waveguide 400) or toward the sky (e.g., the Sun). The layer 410 includes a second, opposite or bottom surface 414 that is adjacent to a top or first surface 422 of a second or intermediate layer 420 of the waveguide 400.

The waveguide layer 410 includes a repeating pattern of microstructures 416 in the form of cone-shape dimples or recesses defined by a conical sidewall 417 extending or protruding a distance from the bottom surface 414 of the layer 410 toward the upper surface 412 of the layer 410. The radius of the base (of the circular opening on surface 414) and the height of the cone-shaped microstructure 416 may be varied to implement the waveguide 400 and one or both of the geometrical parameters may differ among layers 410, 420. In some cases, though, the height of the microstructure 416 is less than about 75 percent of the thickness of the layer 410 while other cases may use a height of less than 25 percent of the thickness of the layer 410. The shape, size, and spacing and/or repeating pattern of the microstructures 416 typically is chosen to achieve a desired TIR function with a range of incidence angles of rays striking the surface 412 of the layer 410.

To provide an air gap or air pockets 450 between the layers 410, 420, the waveguide 400 includes a number of spacers 430 disposed between the two layers 410, 420. More specifically, spacers 430 in the form of glue/adhesive dots are provided on portions of the bottom surface 414 coinciding with gaps between microstructures 416. The thickness of the glue dots/spacers 430 is chosen to provide a desired air gap thickness, $d_{gap}$, which is typically kept quite small. The number of spacers 430 used is also preferably minimized or at least limited as each spacer/glue dot 430 provides a location for light trapped in a layer 410, 420 under TIR to escape the layer 410, 420.

In some implementations, lower index adhesives may be used in place of the air gaps or pockets in a waveguide. However, it may take more layers in the waveguide to achieve the same result because the differential between the adhesive and the polymer (or other material of the layers) is less. The angles of the microstructure will, therefore, be greater (e.g., the sidewalls will have greater slopes). Therefore, more layers are needed in such waveguides to handle all the incoming rays.

As shown in FIGS. 4A and 4B, the waveguide layers may include microstructures on bottom surfaces (surfaces opposite those first being struck by incident rays from the Sun) that are cones. In other cases, though, as shown in FIG. 2, the microstructures may have a four-sided pyramid shape. In other cases, the microstructures may have a three-sided pyramid shape. In each of these implementations, the microstructures typically are symmetrical while some embodiments may use asymmetric microstructure shapes. Both the size and the sidewall angles of the microstructures generally are different for each layer of waveguide. Some embodiments may even use differing sizes and shapes within a single layer, but it may be desirable in many cases to use microstructures that are similar to identical within the same waveguide layer so that the microstructures reflect rays into the desired direction within the waveguide layer or film to provide TIR from incoming rays at specific angles for each layer (e.g., ranges of incidences angles processed by each layer).

Also, the spacing (the repeating pattern) of the microstructures is generally different for each layer of a waveguide (e.g., pick a pattern for each layer so that a prior layer's microstructures do not fully or, in some cases, even partially block or shadow (as viewed from above, for example) the microstructures of a layer (stack the layers in the waveguide but stagger or offset the structures at least partially in each layer)). Further, the orientation relative to other microstructures can be varied from layer-to-layer in the waveguide. Some embodiments may use linear or elongated microstructures (e.g., see the waveguide of layer 7 for an example using linear sawtooth formations or repeated triangular cross section surfaces for the microstructures). Many preferred embodiments, though, use waveguide layers with individual, spaced-apart structures protruding up from the bottom of each layer, while the top side/surface of each layer is planar or flat.

The complexity of designing the multiple waveguide layers, which are each designed for the reflection of light into the material of the layer, becomes increasingly apparent as the incoming angles increase relative to the entry point of the light. At or near a zero azimuth and zero zenith, the rays neatly reflect through the first few layers into the film or material of each layer (see FIG. 1 for example). However, when the incoming angle has changed more drastically, the top few layers containing microstructures designed for light entry at near perpendicular entry points can create chaos with regard to light refraction. Those layers can, thus, become mostly ineffective at directing light within the film (capturing light via TIR) with light at these larger incidence angles.

To address this issue, the waveguides of the present description can be configured such that as the angles of received light get larger (or more radical) the amount of energy due to cosine fall off relative to the geometry of the incoming rays lessens. Since the upper layers (of film or sheets of transparent material) generally have microstructures that better handle (capture with TIR) the rays or direct them in the desired direction (partly due to the lack of chaos on the top few layers), the general efficiency or ray collection is better at those angles. In addition, as rays go through the different indices of refraction and layers, energy is lost through each layer. At the entry point of each layer, as an estimate, five percent or more of the energy in the sunlight is lost as the sunlight goes through one surface and into the next.

The design for microstructures in each layer of a waveguide can be optimized with a computer program. Optimization or enhancement of the structure design (along with its repeated pattern) can be provided by creating polarizations between the indices of the materials. It is useful to understand at this point that within the context of the description that there are nearly infinite combinations of microstructures that can be used successfully in combination to provide a multi-layered waveguide. Stated differently, one important design criteria is that the waveguide layers, in combination, reflect most of the light received by the top surface of the upper waveguide layer into the material of each layer creating TIR, which allows the captured sunlight to be readily converted into electricity or thermal energy.

Stated generally, the waveguides taught herein include differently configured layers (with different microstructures) to capture as much light as possible and guide this captured light to the edges/sides of waveguide. This is regardless of the incidence angles of the sunlight striking the waveguide, with the recognition that the sunlight with more direct angles has the most energy. For example, from −30 to +30 degrees, the collection of the rays (weighted for intensity) may be about 80 percent while only about 50 to 60 percent of the rays may be collected from −30 to −80 degrees and +30 to +80 degrees. However, since most of the energy is at the more direct angles, the average collection is still likely to be quite favorable.

On a cost basis and in 2012 United States dollars, one square meter of the multi-layered waveguide (or waveguide film) was expected to cost less than three dollars ($3.00). In contrast, the PV material alone for the same space (e.g., with an area matching the top exposed surface of the upper waveguide layer) was about one hundred dollars ($100.00). The addition of the PV material along with the waveguide to form a solar power system was estimated to only be about five to ten dollars ($5 to $10) since the PV material required is about ninety-five percent less than in a conventional power system or solar panel. This brings the cost of solar down to less than about fifty cents ($0.50) per Watt as low as twenty-five cents ($0.25) per Watt (capital cost). At this cost level, which is achievable through the use of the waveguides taught herein, solar is at cost parity (or even less) with natural gas and coal.

Figure 5:
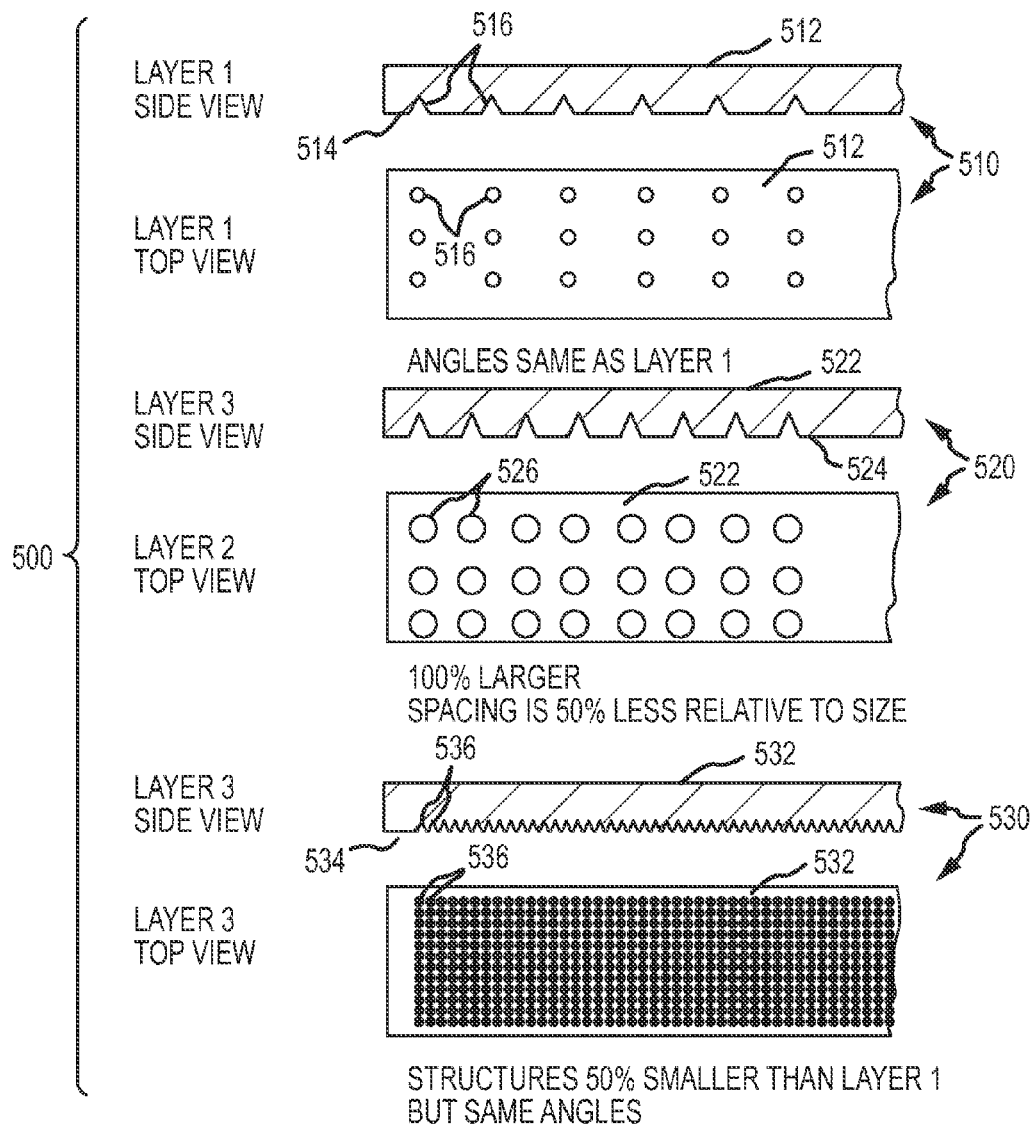
FIG. 5 illustrates a schematically an exploded view of a three-layered waveguide for use in solar power systems.

FIG. 5 schematically illustrates an exploded view of a three-layered waveguide 500 for use in solar power systems (such as the system 100 of FIG. 1). In this waveguide 500, three layers 510, 520, 530 are used to capture a large portion of received sunlight having a range of incidence angles (no solar tracking required), with the first layer 510 being the top layer in the stack or assembly that has a first surface 512 that sunlight initially strikes, with the second layer 520 being the intermediate layer that receives light that is not captured by the first or top layer 510, and with the third layer 530 being the bottom layer that receives light only if it is not captured by either of the first two layers 510, 520 (i.e., receives light from the second layer 520). Each of the layers is formed of or from a transparent material (such as a sheet or film of a polymer), and the thickness of each layer may be identical or may differ to implement the waveguide 500.

While not shown, the three layers 510, 520, 530 could be bound together in a stacked or laminated manner using any of the techniques described herein such as an adhesive layer or spacers to provide an air gap or air pockets between the adjacent layers (such as between layer 510 and layer 520 and between layer 520 and layer 530). Once assembled, the multi-layered waveguide 510 may be positioned within a solar power system and the light captured in each layer 510, 520, 530 may be guided to one or more solar absorbers for conversion into useful energy (such as PV material to produce electricity).

As shown, the top layer 510 includes a top surface 512 that first receives sunlight and a second surface 514 opposite the first surface 512 that second receives the sunlight transmitted through the first surface 512 and the material of the top layer 510. To capture at least a portion of this sunlight, the top layer 510 includes a microstructure region made up of a plurality of recessed surfaces or dimples 516 formed from a sidewall extending upward from the second surface 514 toward the first surface 512. Each of these surfaces or dimples 516 (or microstructures) is conical in shape with a base radius and height defining their size and shape. The shape can also be said to be defined by the angles of their sidewalls relative to the surface 514 (or to a line bisecting the cones).

These geometrical or shape-defining and size-defining parameters may be chosen to achieve a desired TIR affect with incident light within a particular range of incidence angles. For example, the height may be less than about 25 percent of the thickness of the top layer's thickness and the base radius (or sidewall angle) is chosen to provide TIR for light striking the surface 512 at an angle in the range of −5 to +5 degrees. Further, the pattern, which defines the density of the microstructures 516 and their location relative to each other, that is repeated may be chosen to capture a significant percentage of the received light while allowing another portion to pass to subsequent layers 520, 530 rather than being reflected out/lost from the waveguide 500.

As shown in FIG. 5, the second layer 520 includes a top or first surface 522 that is positioned in the waveguide 500 to be proximate and parallel to the bottom or second surface 514 of the first layer 510. In this way, light that is not captured by the first layer 510 and not reflected out of this layer 510 is transmitted onto the top surface 522 (after passing through an air gap or adhesive layer (not shown)). This received sunlight is transmitted through top surface 522 into the material of the second layer 520 where it strikes the second or bottom surface 524 of the second layer 520. The bottom surface 524 is configured to include a plurality of recessed surfaces or dimples (or microstructures) 526 that are conical shaped and arranged in a repeating pattern across surface 524.

The conical microstructures 526 are each defined by a sidewall extending upward a distance from the bottom surface 524 toward the top surface 522 of the second layer 520 at a particular angle (defining sidewall slope). The microstructures 526 are shown to have the same shape as the conical microstructures 516 of the first layer but to have a different size (e.g., different base radius and height). For example, the height of the microstructures may be chosen to be between 50 and 75 percent of the thickness of the layer 520, with the base radius (or sidewall angle or slope) chosen to cause the microstructures 526 to have the same shape as the conical microstructures 516 in layer 510. Further, the pattern of the microstructures 526, shown in FIG. 5, calls for less spacing between adjacent microstructures 526 (less row and column spacing in this case). Particularly, the conical microstructures 526 are twice the size of the microstructures 516 and have about half the spacing. The change in size and spacing (but retaining the shape) may be useful for capturing a different portion of the incident light and/or for capturing the same incident light (same incidence ranges as layer 510) that was not successfully capture by the first layer 510. For example, the layer 520 may be suited for providing TIR for light striking the surface 512 of the first layer 510 with incidence angles in the range of −15 to +15 degrees (or only −15 to −5 degrees and +5 to +15 degrees in some cases).

Further as shown in FIG. 5, the third layer 530 includes a top or first surface 532 that is positioned in the waveguide 500 to be proximate and parallel to the bottom or second surface 524 of the second layer 520. Light that is not captured by the second layer 520 and not reflected out of this layer 520 is transmitted onto the top surface 532 (after passing through an air gap or adhesive layer (not shown)). This received sunlight is transmitted through top surface 532 into the material of the second layer 530 where it strikes the second or bottom surface 534 of the third layer 530. The bottom surface 534 is configured to include a plurality of recessed surfaces or dimples (or microstructures) 536 that are conical shaped and arranged in a repeating pattern across surface 534.

The conical microstructures 536 are each defined by a sidewall extending upward a distance from the bottom surface 534 toward the top surface 532 of the third layer 530 at a particular angle (defining sidewall slope). The microstructures 536 are shown to have the same shape as the conical microstructures 516 and 526 of the first and second layers but to have a different size (e.g., different base radius and height). For example, the height of the microstructures 536 may be chosen to be between 10 and 25 percent of the thickness of the layer 530, with the base radius (or sidewall angle or slope) chosen to cause the microstructures 536 to have the same shape as the conical microstructures 516 in layer 510.

Further, the pattern of the microstructures 536, shown in FIG. 5, calls for less spacing between adjacent microstructures 536 (less row and column spacing in this case) than in layer 520. Particularly, the conical microstructures 536 are about half the size of the microstructures 516 and have a relatively small spacing to no spacing. The change in size and spacing (but retaining the shape) may be useful for capturing a different portion of the incident light and/or for capturing the same incident light (same incidence ranges as layer 520) that was not successfully capture by the first layer 520. For example, the layer 530 may be suited for providing TIR for light striking the surface 512 of the first layer 510 with incidence angles in the range of −30 to +30 degrees (or only −30 to −15 degrees and +15 to +30 degrees in some cases).

Figure 6:
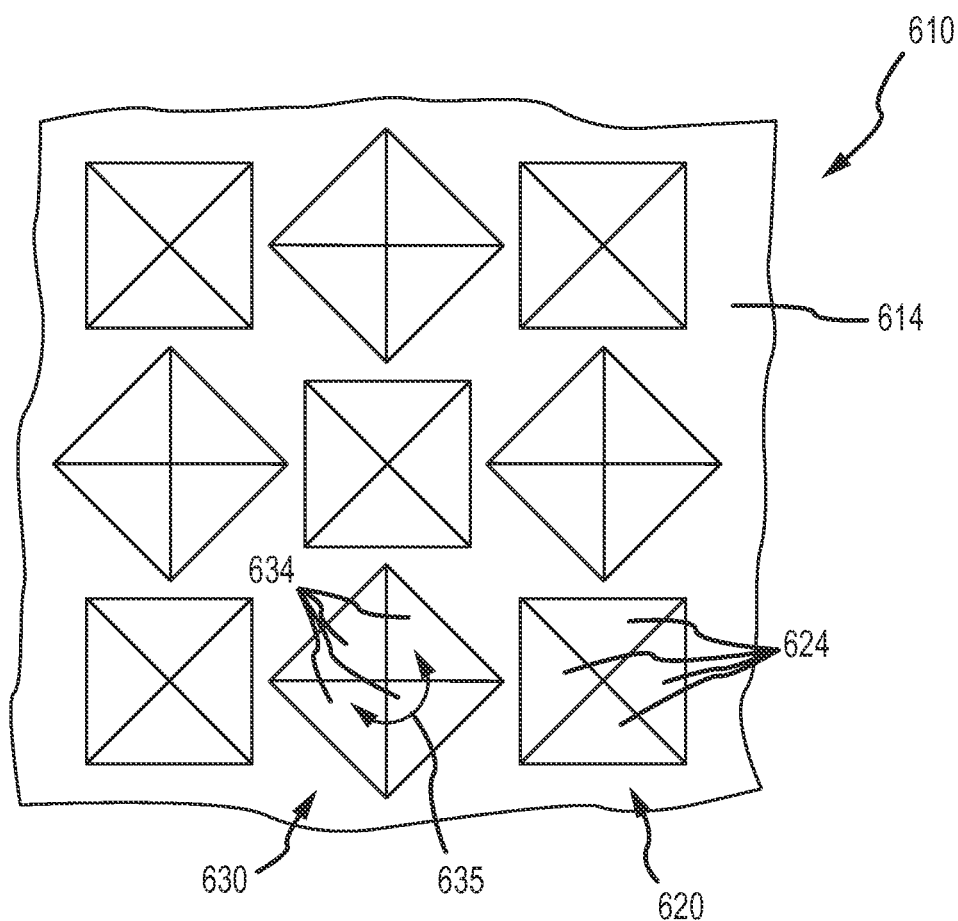
FIG. 6 illustrates a bottom view of an exemplary layer of a multi-layered waveguide illustrating one useful pattern (that can be repeated across the bottom surface of the layer to provide a microstructure region for providing TIR) making use of four-sided pyramid shapes for the dimples or recessed surfaces ("microstructures")

FIG. 6 illustrates a bottom view of portion of an exemplary layer 610 of a multi-layered waveguide illustrating one useful pattern that can be repeated across the bottom surface of the layer to provide a microstructure region for providing TIR. The layer 610 has a bottom surface 614 (side or surface of the layer 610 opposite the side initially being struck by sunlight) that would abut or be proximate to an adjacent layer in the waveguide. The layer 610 includes a first set of microstructures 620 having a first orientation and a second set of microstructures 630 having a second orientation, which differs from the first orientation.

Particularly, some embodiments of the waveguides of the present description include microstructures that are similar in shape and size as their neighbors (adjacent microstructures) but that are rotated relative to their neighbors in the repeated pattern. Such rotation is useful to decrease or even eliminate ray reflection upward between the microstructures. In some waveguides, the intermediate and lower layers will include such rotated (or differently oriented) microstructures in their repeated pattern. In this example, the microstructure region makes use of four-sided pyramid shapes for the dimples or recessed surfaces ("microstructures") 620, 630, as shown with sides 624 and 634, respectively.

The microstructure 620 has a first orientation such as having the base sides of the sidewalls 624 being parallel to sides or edges of the waveguide layer. The microstructure 630, which is adjacent to the microstructure 620 or its neighbor, is rotated (as shown with arrow 635) about its axis (in the design stage defining the pattern shown in FIG. 6 with the structures 630 being, of course, stationary in the layer 610) such that it has a different orientation than that of the microstructures 620. The orientation variance or difference may be in the range of 10 to 85 degrees with a difference in orientation of about 45 degrees being useful in some embodiments of the layer 610 as is shown in FIG. 6.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

For example, repeating patterns of individual and spaced apart microstructures are shown in the figures and described in detail herein, but some embodiments of the waveguides may utilize elongated or linear microstructures that may extend fully or partially across the bottom surfaces of each (or some) of the layers of a waveguide (e.g., with a triangular cross section). These linear microstructures may be provided to be spaced apart and parallel to each other. The discussion of varying sizes, geometries/shapes, and spacing between adjacent microstructures described herein is also applicable to linear microstructures.

For example, FIG. 7 illustrates a waveguide layer 710 that may be used in any of the waveguides described herein. As shown, the layer 710, which may be a sheet or film of clear plastic, glass, or ceramic, includes an upper planar surface 712 and a spaced apart lower surface 714. In a waveguide, the upper planar surface 712 may be exposed to sunlight or may be positioned to be proximate to a lower surface of another waveguide layer higher up in the stack of the waveguide. The lower or second surface 714 has a microstructure region for providing TIR of light having a certain incidence angle (on the surface 712, for example) or one falling within a range.

The microstructure region is made up of a plurality of linear recessed surfaces or microstructures 720 providing a linear sawtooth pattern or formation in the surface 714. No space is shown between structures 720, but some embodiments may provide for a planar length of surface 714 between microstructures 720. The recessed surfaces 720 are defined by sidewalls 722, 724 that protrude into the material of waveguide layer 710 toward the first or upper surface 712, and the recessed surfaces 720 are linear in that the sidewalls 722, 724 extend from between sides/ends of the waveguide layer 710. The shape and size of the recessed surfaces 720 provided by sidewalls may be similar to those described above with regard to the cone and pyramid-shaped. For example, the height of the triangular cross section of each microstructure 720 may be less than about 75 percent of the thickness of the layer 710 and often less than 25 percent. In some cases, both the height of the triangular-shaped structures 720 and their bases are less than 200 microns to implement the waveguide layer 710.

Solar power systems may be built using the waveguides taught herein to better capture sunlight for energy conversion. In these systems, the collectors or absorbers, which may be linear strips, planar sheets/films, or more circular spots/circular area elements and which may be formed of PV material, can be placed on the top or bottom surfaces of the waveguide such as along one end or edge of the top or bottom surface of the top or bottom layer of the waveguide. In the areas of the waveguide adjacent (above or below) the collectors or absorbers, the layers may be free of microstructures (e.g., to allow the TIR-trapped sunlight to escape the layers into the collector/absorber material). To this end, the elimination of microstructures may be provided by melting or melding the material of the layers before or after assembly into a stack of layers, i.e., a multi-layered waveguide.

To provide air space between layers, the waveguide may be fabricated using dots or lines/strips of the film material, using coatings on layer surfaces including mirror, opaque, or transparent coating materials, ink, or nearly any polymer to provide a plurality of spaced-apart spacers. As discussed, air gaps or at least pockets are sometimes desirable to separate the refractive indices between adjacent layers so as to allow the microstructures to promote TIR between the layers. In some cases, these gaps or pockets are filled with water, liquid, or a coating with a differential of more than 10 percent in index of refraction between the material of the layer(s) and the gap-filling material (water, liquid, or coating).

I claim:

1. A waveguide for use in solar power systems to capture sunlight, comprising:

a first layer of substantially transparent material with a first thickness, wherein the first layer has a first surface that is exterior for receiving sunlight and a second surface, opposite the first surface of the first layer, comprising a plurality of recessed surfaces each defined by one or more sidewall extending from the second surface toward the first surface of the first layer; and a second layer of substantially transparent material with a second thickness, wherein the second layer has a first surface proximate to the second surface of the first layer for receiving a portion of the sunlight transmitted through the first layer toward the second layer and wherein the second layer has a second surface, opposite the first surface of the second layer, comprising a plurality of recessed surfaces each defined by one or more sidewall extending from the second surface toward the first surface of the second layer, wherein the recessed surfaces of the first layer are configured to trap at least a portion of the sunlight in the first layer with total internal reflection (TIR), wherein the recessed surfaces of the second layer are configured to trap at least a portion of the sunlight transmitted through the first layer toward the second layer with TIR, wherein the recessed surfaces have sidewalls defining symmetric pyramids, wherein the recessed surfaces of the first layer provide TIR of light striking the first surface of the first layer in a first range of incidence angles, wherein the recessed surfaces of the second layer provide TIR of light striking the first surface of the first layer in a second range of incidence angles differing from the first range of incidence angles, wherein the heights of the recessed surfaces defined by the sidewalls of the recessed surfaces are equal within each of the first and second layers and differ between the first and second layers, and wherein spacing between adjacent ones of the recessed surfaces differs between the first and second layers.

2. The waveguide of claim 1, wherein the first surfaces of the first and second layers are planar and are parallel.

3. The waveguide of claim 1, wherein the recessed surfaces of the first layer provide TIR of light striking the first surface of the first layer in a first range of incidence angles from the Sun and wherein the recessed surfaces of the second layer provide TIR of light striking the first surface of the first layer in a second range of incidence angles from the Sun differing from the first range of incidence angles.

4. The waveguide of claim 1, wherein the pyramids defined by the sidewalls of the recessed surfaces have heights of less than about 25 percent of the first and second thicknesses of the first layer and the second layer, respectively, and wherein the heights and bases of the pyramids are less than about 200 microns.

5. The waveguide of claim 4, wherein the heights of pyramids defined by the sidewalls of the recessed surfaces are equal within each of the first and second layers and differ between the first and second layers.

6. The waveguide of claim 1, wherein adjacent ones of the pyramids defined by the sidewalls have first and second orientations with the second orientations being rotated by 30 to 60 degrees.

7. The waveguide of claim 3, wherein the first range of incidence angles is from −5 to +5 degrees and the second range of incidence angles includes from −5 to −15 degrees and from +5 to +15 degrees.

8. The waveguide of claim 1, wherein an air-filled gap is provided between the second surface of the first layer and the first surface of the second layer.

9. The waveguide of claim 8, wherein the air-filled gap is formed by providing a plurality of spaced-apart dots or lines of material between the second surface of the first layer and the first surface of the second layer.

10. The waveguide of claim 1, wherein a gap is provided between the second surface of the first layer and the first surface of the second layer and the gap is filled with a material with an index of refraction that differs from an index of refraction of the transparent materials of the first and second layers by more than 10 percent.

11. The waveguide of claim 1, further comprising an adhesive layer between the second surface of the first layer and the first surface of the second layer, wherein the adhesive layer has an index of refraction that differs from an index of refraction of the transparent material of the first layer by more than 10 percent.

12. A waveguide for capturing and guiding sunlight, comprising:

a first waveguide layer with a first surface and a second surface, opposite the first surface, including a microstructure region providing total internal reflection (TIR) of light striking the first surface, within the first waveguide layer, at a first range of incidence angles;

a second waveguide layer with a first surface proximate to the second surface of the first waveguide layer and with a second surface, opposite the first surface of the second waveguide layer, including a microstructure region providing TIR of light striking the first surface of the first waveguide layer, within the second waveguide layer, at a second range of incidence angles differing from the first range of incidence angles; and a third waveguide layer with a first surface proximate to the second surface of the second waveguide layer and with a second surface, opposite the first surface of the third waveguide layer, including a microstructure region providing TIR of light striking the first surface of the first waveguide layer, within the third waveguide layer, at a third range of incidence angles differing from the first and second ranges of incidence angles, wherein the microstructure region of the first waveguide layer includes recessed surfaces providing the TIR of light striking the first surface of the first waveguide layer, wherein the microstructure region of the second waveguide layer includes recessed surfaces providing the TIR of light striking the first surface of the second waveguide layer, wherein the heights of the recessed surfaces defined by the sidewalls of the recessed surfaces are equal within each of the first and second waveguide layers and differ between the first and second waveguide layers, and wherein spacing between adjacent ones of the recessed surfaces differs between the first and second waveguide layers.

13. The waveguide of claim 12, further comprising adhesive layers between the first and second waveguide layers and between the second and third waveguide layers, wherein the adhesive layers each have an index of refraction that differs from an index of refraction of the first, second, and third waveguide layers by more than 10 percent.

14. The waveguide of claim 13, further comprising a gap between the first and second waveguide layers that is filled with air or with a liquid or coating with an index of refraction that differs from an index of refraction of the first and second waveguide layers by at least 10 percent.

15. The waveguide of claim 12, wherein each of the microstructure regions comprises a plurality of microstructures providing the recessed surfaces and formed in the second surface of each of the waveguide layers with one or more sidewalls protruding toward the second surface of the respective waveguide layer to have a four-sided pyramid shape.

16. The waveguide of claim 15, wherein the microstructures of the first waveguide layer differ from the microstructures of the second waveguide layer at least in one of shape, size, and orientation.

17. The waveguide of claim 16, wherein the microstructures of the second waveguide layer differ from the microstructures of the third waveguide layer at least in one of shape, size, spacing on the second surface, and orientation.

18. A waveguide for use in solar power systems to capture sunlight, comprising:

a first layer of substantially transparent material with a first thickness, wherein the first layer has a first surface that is exterior for receiving sunlight and a second surface, opposite the first surface of the first layer, comprising a plurality of recessed surfaces each defined by one or more sidewall extending from the second surface toward the first surface of the first layer; and a second layer of substantially transparent material with a second thickness, wherein the second layer has a first surface proximate to the second surface of the first layer for receiving a portion of the sunlight transmitted through the first layer toward the second layer, wherein the second layer has a second surface, opposite the first surface of the second layer, comprising a plurality of recessed surfaces each defined by one or more sidewall extending from the second surface toward the first surface of the second layer, wherein the recessed surfaces of the first layer are configured to trap at least a portion of the sunlight in the first layer with total internal reflection (TIR), wherein the recessed surfaces of the second layer are configured to trap at least a portion of the sunlight transmitted through the first layer toward the second layer with TIR, wherein the recessed surfaces of the first layer provide TIR of light striking the first surface of the first layer in a first range of incidence angles, wherein the recessed surfaces of the second layer provide TIR of light striking the first surface of the first layer in a second range of incidence angles differing from the first range of incidence angles, wherein the heights of the recessed surfaces defined by the sidewalls of the recessed surfaces are equal within each of the first and second layers and differ between the first and second layers, and wherein spacing between adjacent ones of the recessed surfaces differs between the first and second layers.

19. The waveguide of claim 18, wherein the recessed surfaces have sidewalls defining symmetric pyramids having heights of less than about 25 percent of the first and second thicknesses of the first layer and the second layer, respectively.

20. The waveguide of claim 19, wherein adjacent ones of the pyramids defined by the sidewalls have first and second orientations with the second orientations being rotated by 30 to 60 degrees.

21. The waveguide of claim 18, wherein the first range of incidence angles is from −5 to +5 degrees and the second range of incidence angles includes from −5 to −15 degrees and from +5 to +15 degrees.

22. The waveguide of claim 18, further comprising an adhesive layer between the second surface of the first layer and the first surface of the second layer, wherein the adhesive layer has an index of refraction that differs from an index of refraction of the transparent material of the first layer by more than 10 percent.

* * * * *